United States Patent [19]

Risher et al.

[11] Patent Number: 4,626,804

[45] Date of Patent: Dec. 2, 1986

[54] ECL TERMINATOR COMPRISED OF A PLURAL RESISTOR NETWORK

[75] Inventors: Ted H. Risher, Pompano Beach; Glenn F. Wolfe, Plantation, both of Fla.

[73] Assignee: Harris Corporation, Melbourne, Fla.

[21] Appl. No.: 689,472

[22] Filed: Jan. 7, 1985

[51] Int. Cl.[4] .............................................. H01P 1/24
[52] U.S. Cl. ................... 333/22 R; 338/320; 338/260; 61/407
[58] Field of Search ................... 333/22 R, 81 A, 172; 338/226, 260, 262, 272, 273, 276, 295, 304, 306, 307, 312, 315, 319, 320; 361/395, 397, 401, 404, 407; 174/52 PE

[56] References Cited

U.S. PATENT DOCUMENTS 3,939,558  2/1976  Riley ........................ 174/52 PE X
4,337,453  6/1982  Nagashima et al. ............... 338/320
4,365,284 12/1982  Tanaka ...................... 338/320 X Primary Examiner—Eugene R. LaRoche
Assistant Examiner—Benny T. Lee
Attorney, Agent, or Firm—Antonelli, Terry & Wands

[57] ABSTRACT

A circuit/packaging arrangement for terminating and decoupling emitter coupled logic comprises a plurality of terminating impedance components (resistors) and decoupling capacitor one end of each of which is connected via a common conductor to one pair of a multipin single-in-line package (SIP). The other ends of the terminating impedance and the capacitor are connected to respective terminal pins adjacent to the one pin of the SIP. The decoupling capacitor that is coupled with the terminating resistors is located, both physically and electrically, at the middle of the distribution or terminating resistors contained within the SIP, such that the resistors are distributed effectively/symmetrically on either side of the capacitor. This location of the capacitor effectively in the middle of the terminating network minimizes line inductance of the common (−2v) conductor to which one end of each of the resistors is connected.

9 Claims, 2 Drawing Figures

ECL TERMINATOR COMPRISED OF A PLURAL RESISTOR NETWORK

FIELD OF THE INVENTION

The present invention relates to signal coupling networks and is particularly directed to a circuit/packaging arrangement for terminating and decoupling emitter-coupled logic network ports.

BACKGROUND OF THE INVENTION

With the continuing miniaturization and increased packaging density of electronic circuit components optimization of the arrangement of such components on printed circuit boards and access to signal ports for such components constitutes an ever present hardware design goal. Within this two-fold effort the impact of signal port positioning on electrical signal characteristics is a significant control criterion. Typically, the electronic components on a printed circuit board will contain a number of logic circuits the operation of which requires appropriate voltage bias and signal termination connections to terminal leads that are electrically coupled to the internal circuitry of the component packages.

SUMMARY OF THE INVENTION

In accordance with the present invention, there is provided a new and improved circuit/packaging arrangement which both facilitates termination and decoupling of electronic components on a printed circuit board, and also minimizes unwanted signal interference at the coupling ports. The present invention is particularly configured for use with emitter coupled logic networks of present day data/signal processing systems, such as ECL logic.

For this purpose the invention comprises a plurality of terminating impedance components (resistors) and a decoupling capacitor, each of said resistors and capacitor having an end which is connected via a common conductor to one pair of a multi-pin single-in-line package (SIP). The other ends of the terminating impedance and the capacitor are connected to respective terminal pins adjacent to the one pin of the SIP. Advantageously, the decoupling capacitor that is coupled with the terminating resistors is located, both physically and electrically, at the middle of the distribution of terminating resistors contained within the SIP, such that the resistors are distributed effectively symmetrically on either side of the capacitor. This location of the capacitor effectively in the middle of the terminating network minimizes line inductance of the common (−2 v) conductor to which one end of each of the resistors is connected. Also contained within the SIP is a separate decoupling capacitor for use with the coupling of the power supply to the ECL integrated circuit, opposite ends of the capacitor being coupled to an additional pair of pins of the SIP. Thus, by providing both a signal termination network and power supply decoupling capacitor within a common single-in-line package, the invention offers an improvement in both connection routability (it does not block any additional channels in the horizontal direction across the plane of the logic package and only a single channel in the vertical direction relative to the pin distribution across the logic package) and provides improved electrical coupling characteristics for the logic circuitry.

DETAILED DESCRIPTION

Figure 1:
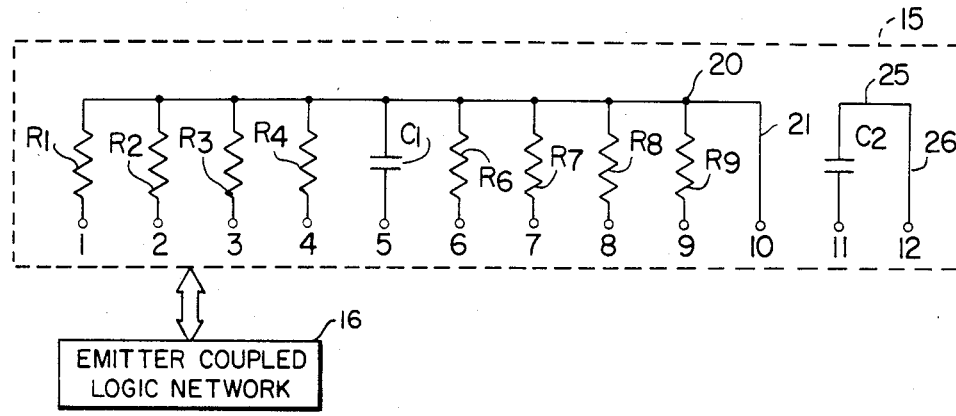
FIG. 1 is a schematic circuit diagram of the terminating and decoupling single-in-line package of the present invention.

Referring now to FIG 1, there is shown an electrical circuit diagram of the individual components of and the layout of such components housed within a single-in-line package 15 which may be used to terminate and decouple an ECL network 16, such as that employed in present day signal/data processing systems. The single-in-line package is shown as a 12 pin package having terminal pins 1-12. Along one edge of the package terminal pins 1-4 and 6-9 are respectively connected to one end of each of a terminating resistor R1-R4 and R6-R9. The other ends of each of the terminating resistors are connected in common to a conductor 20 which extends throughout the package in parallel to the distribution of pins 1-10, terminating at one end at resistor R1 and at the other end at a conductor 21 which extends from the conductor 20 to the terminal pin 10.

Centrally located between respective sets of resistors R1-R4 and R6-R9 is a decoupling capacitor C1, one end of which is connected to conductor 20 and the other end of which is connected terminal pin 5 of the SIP. The terminal pins of each of the resistors may be connected to respective terminating ports of the emitter coupled logic circuitry of the logic package with which the terminating and decoupling network of the present invention is associated. For example, respective ones of the resistors R1-R4 and R6-R9 may be connected to the emitter leads of respective transistors within the logic circuit through the pin connections 1-4 and 6-9. For terminating the resistors, conductors 20 and 21 tie each of the resistors to a terminating voltage (e.g. minus 2 volts). This effectively terminates the signal networks if the resistor values approximate the impedance of the printed circuit trace. For present day ECL circuit components, resistors R1-R4 and R6-R9, may be on the order of 68 or 82 ohms. Capacitor C1, disposed centrally of resistor networks R1-R4 and R6-R9 effectively decouples the terminating voltage at pin 10 to ground. Namely, pin 5 is connected to a reference potential terminal (ground). Because capacitor C1 is located effectively in the middle of the two halves of the overall resistor network, the inductance associated with internal power conductor 20, coupled via lead 21 to terminating voltage at pin 10, is effectively minimized.

Also included within the single-in-line package of the present invention is an additional decoupling capacitor C2, one end of which is connected to terminal pin 11, and the other end of which is connected to an internal power conductor 25, which is coupled through lead 26 to terminal pin 12. Pins 11 and 12 are employed for supplying power to the emitter coupled logic chip and, by providing the capacitor C2 within the package itself, space is saved on the printed circuit board for a separate discrete capacitor.

Figure 2:
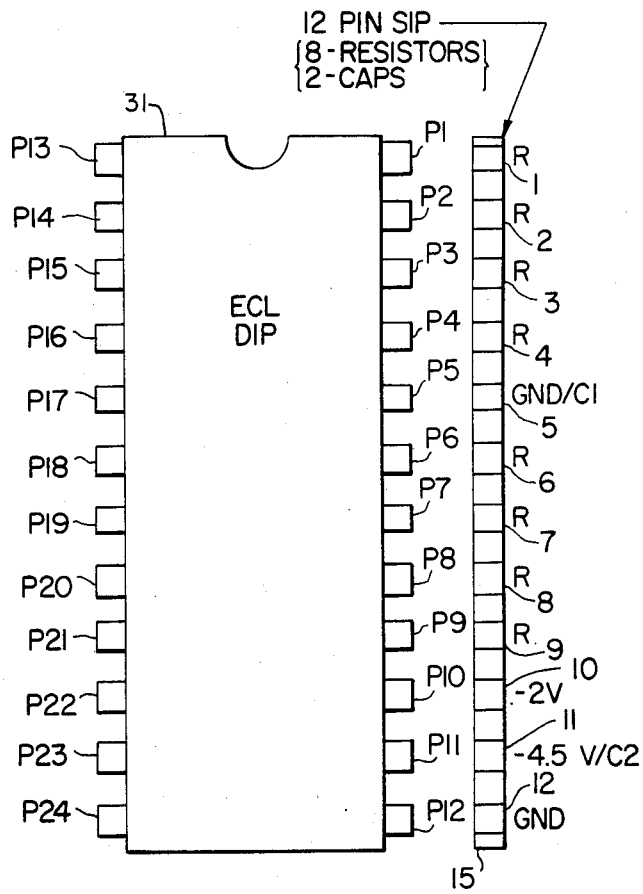
FIG. 2 shows the correspondence between the configuration of an embodiment of a single-in-line package housing the components of the arrangement of FIG. 1 and the terminal pin configuration of an ECL logic dual-in-line package (DIP).

FIG. 2 shows the manner in which the single-in-line package 15 obtaining the circuitry arrangement of FIG. 1 is associated with an ECL dual-in-line package. As shown in FIG. 2, the ECL logic package 31 is a 24 pin device, having respective pairs of 12 pins per side, comprised of pins P1-P12 and P13-P24. Pins P1-P12 are shown as being disposed immediately adjacent pins 1-12 of the single-in-line package of FIG. 1. This permits simplified signal network and voltage coupling between the terminal pins of the single-in-line package of the present invention and the internal circuitry of the ECL package. On the printed circuit board itself, because the circuit package of the present invention is a single-in-line package, considerable space is saved, thereby improving routability and reducing the number of physical components on the printed circuit board.

As will be appreciated from the foregoing description of the present invention, there is provided an improved multiple pin single-in-line package which both terminates internal signal networks of an ECL logic package and decouples internal power leads for the signal network package. Because the package is a single-in-line package, it offers a significant savings in occupation area on the printed circuit board where the components are housed. Where a decoupling capacitor is associated with the terminating resistor network, it is advantageously disposed centrally of the distribution of the resistor network within the single-in-line package so as to minimize inductance normally associated with the internal power lead, thereby improving the noise rejection capability of the device.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A device for terminating an electrical signal network comprising:
   a single-in-line package having a plurality of terminal pins disposed along one side thereof;
   a first conductor supported by said package and extending apart from but substantially parallel to the disposition of said plurality of terminal pins along said one side of said package;
   means for coupling one of said plurality of terminal pins to said conductor; and
   a plurality of resistor elements supported by said package and disposed parallel to one another such that one end of each of said resistor elements is connected to said first conductor and a second end of each of said resistor elements is connected to a respective terminal pin of said plurality of terminal pins other than said one terminal pin; and
   a frequency responsive impedance element one end of which is connected to said first conductor and a second end of which is connected to another of said plurality of terminal pins, said frequency responsive impedance element being disposed among said resistor elements at a position which effectively minimizes the inductance associated with said first conductor between the respective one end of each of said resistor elements and said one end of said frequency responsive impedance element.

2. A device according to claim 1, wherein said frequency responsive impedance element comprises a capacitor.

3. A device according to claim 1, wherein said plurality of resistor elements is comprised of two sets of resistor elements respectively connected between said first conductor and a first set of consecutive terminal pins and between said first conductor and a second set of consecutive terminal pins, respectively, and wherein said another terminal pin is disposed between said first and second sets of consecutive terminals pins.

4. A device according to claim 3, wherein said frequency responsive impedance element comprises a capacitor.

5. A device according to claim 4, wherein said one of said terminal pins is disposed adjacent to an end pin of one of said first and second sets of consecutive terminal pins.

6. A device according to claim 1, further comprising first and second additional terminal pins disposed in line with and adjacent to said plurality of terminal pins along said one side of said package, and a decoupling capacitor connected between said first and second additional terminal pins.

7. A device for terminating an emitter coupled logic network comprising:
   a single-in-line package having a plurality of terminal pins disposed in a line along one side of said package, selected ones of said pins being adapted to be coupled to emitter leads to transistors of said network;
   a conductor supported by said package and extending in a direction substantially parallel to said line but spaced apart from said plurality of terminal pins, one end of said conductor being connected to an end one of said terminal pins, said end one of said terminal pins being adapted to be coupled to a prescribed terminating voltage for said emitter coupled logic network;
   a first plurality of resistor elements supported by said package and disposed parallel to one another such that one end of each of said first plurality of resistor elements is connected to said conductor and a second end of each of said first plurality of resistor elements is connected to a respective one of a first set of said selected ones of said plurality of terminal pins;
   a second plurality of resistor elements supported by said package and disposed parallel to one another such that one end of each of said second plurality of resistor elements is connected to said conductor and a second end of each of said second plurality of resistor elements is connected to a respective one of a second set of said selected ones of said plurality of terminal pins, said second set being separated from said first set;
   a capacitor element disposed parallel to said resistor elements and one end of which is connected to said conductor and a second end of which is connected to a prescribed one of said plurality of terminal pins that is disposed between said first and second sets of said plurality of terminal pins, said prescribed one of said plurality of terminal pins being adapted to be coupled to a source of reference potential so that said capacitor effectively decouples said prescribed terminating voltage to said reference potential.

8. A device according to claim 7, further comprising first and second additional terminal pins disposed in line with and adjacent to said plurality of terminal pins along said one side of said package, and a decoupling capacitor connected between said first and second additional terminal pins.

9. A device according to claim 8, wherein said first additional terminal pin is adapted to be coupled to said source of reference potential and said additional reference potential is adapted to be coupled to a prescribed power supply voltage for said emitter coupled logic network.

* * * * *